United States Patent
Groe et al.

(10) Patent No.: US 8,067,989 B1
(45) Date of Patent: Nov. 29, 2011

(54) ALTERNATE CLOCK APPARATUS AND METHODS FOR IMPROVING RADIO PERFORMANCE

(75) Inventors: John B. Groe, Poway, CA (US); Carrie Lo, Newport Beach, CA (US)

(73) Assignee: Quintic Holdings, Santa Clara, CA (US)

( * ) Notice: Subject to any disclaimer, the term of this patent is extended or adjusted under 35 U.S.C. 154(b) by 42 days.

(21) Appl. No.: 12/422,744

(22) Filed: Apr. 13, 2009

Related U.S. Application Data

(60) Provisional application No. 61/044,234, filed on Apr. 11, 2008.

(51) Int. Cl.
 *H03L 7/099* (2006.01)
 *H03L 7/18* (2006.01)
(52) U.S. Cl. .......... 331/34; 331/45; 331/57; 331/177 R; 327/156
(58) Field of Classification Search .......... 331/57, 331/74, 45, 177 R, 34, 16; 327/156
See application file for complete search history.

(56) References Cited

U.S. PATENT DOCUMENTS

| | | | | |
|---|---|---|---|---|
| 5,889,436 A * | 3/1999 | Yeung et al. | .......... | 331/2 |
| 6,337,601 B1 * | 1/2002 | Klemmer | .......... | 331/34 |
| 6,788,154 B2 * | 9/2004 | Maneatis | .......... | 331/45 |
| 7,741,889 B2 * | 6/2010 | Chou | .......... | 327/157 |
| 2006/0255867 A1 * | 11/2006 | May | .......... | 331/57 |

* cited by examiner

*Primary Examiner* — Ryan Johnson
(74) *Attorney, Agent, or Firm* — Blairtech Solution LLC

(57) ABSTRACT

An alternate clock apparatus and method configured to reduce noise in selected frequency bands in an electronic device such as a communication device is described. In one embodiment the alternate clock includes a ring oscillator to generate multiple time shifted signals which may then be combined to generate clock signals at alternate frequencies to a primary reference. A resynchronization circuit may be coupled to the ring oscillator to periodically resynchronize the ring oscillator to a reference signal to reduce alternate clock jitter.

3 Claims, 3 Drawing Sheets

Modified Ring Oscillator schematic

Radio System with Clock Distribution

Integer-N PLL with Ring Oscillator

Modified Ring Oscillator schematic

Modified Ring Oscillator timing diagram

Re-Synced Ring Oscillator schematic

Re-Synced Ring Oscillator timing diagram

ALTERNATE CLOCK APPARATUS AND METHODS FOR IMPROVING RADIO PERFORMANCE

CROSS REFERENCE TO RELATED APPLICATIONS

This application claims priority under 35 U.S.C. §119(e) to U.S. Provisional Patent Application Ser. No. 61/044,234, entitled ALTERNATE CLOCK APPARATUS AND METHOD FOR IMPROVING RADIO PERFORMANCE, filed Apr. 11, 2008. The content of this application is hereby incorporated by reference herein in its entirety for all purposes.

FIELD OF THE INVENTION

The present invention relates generally to radio transceivers operating over a wide range of frequency channels and thus subject to the problems that occur due to clock related spurious signals. More particularly but not exclusively, the present invention relates to alternate clock implementations for redistributing clock energy to improve RF performance.

BACKGROUND

Modern radio transceivers often combine RF functions with digital circuitry. These mixed signal integrated circuits expand system capability and reduce cost, but present several design challenges.

One fundamental challenge facing mixed-signal systems is digital noise due to switching transients. It is impossible to prevent the noise from coupling through the substrate and package to sensitive analog designs. As a result, the noise unavoidably degrades radio transceiver performance. The power spectral density or spectrum of the digital switching noise usually appears at integer multiples of the data rate. Moreover, the noise typically increases at higher data rates.

In practice, the radio transceiver must support a wide range of RF channel frequencies, some of which occur near or at multiples of the digital data rate and coincident with the highest noise levels. The resulting problems tend to be more severe in narrowband systems, and it is not uncommon for this noise to degrade radio performance and cause failures. Accordingly, there is a need for new approaches to combat switching related noise.

SUMMARY

The present invention relates to apparatus and methods for altering the spectrum of the digital switching noise to improve radio performance in sensitive channels are described.

In one aspect, the present invention relates to an apparatus for generating a clock signal including a ring oscillator, a multiplexer coupled to the output of a plurality of stages of the ring oscillator, and a control circuit coupled to the multiplexer to select two or more of the outputs of the plurality of stages of the ring oscillator to generate an output signal.

In another aspect, the present invention relates to an apparatus for generating a clock signal including a ring oscillator, an input multiplexer coupled to an input and an output of the ring oscillator, an output multiplexer coupled to the output of a plurality of stages of the ring oscillator, a first control circuit coupled to the output multiplexer to select two or more of the outputs of the plurality of stages of the ring oscillator to generate an output signal, and a second control circuit coupled to the ring oscillator and input multiplexer to select one of the output of the ring oscillator and a reference signal to be provided to the ring oscillator.

In another aspect, the present invention relates to a method of generating a clock signal including generating a plurality of time shifted signals at a first frequency, selecting two or more of the time shifted signals, and generating an output signal based on the two or more time shifted signals, where the output signal has a frequency different from the first frequency.

In another aspect, the present invention relates to a method of generating a clock signal including generating a plurality of time shifted signals in a ring oscillator at a first frequency, selecting two or more of the time shifted signals, generating an output signal based on the two or more time shifted signals, and periodically resynchronizing the ring oscillator to a reference signal.

In another aspect, the present invention relates to a communication device including a first clock circuit configured to generate a first clock signal at a first clock frequency and a second clock circuit configured to generate a second clock signal at a second clock frequency different from the first clock frequency.

Additional aspects of the present invention are further described below with respect to the appended drawings.

BRIEF DESCRIPTION OF THE DRAWINGS

The following is a brief description of the drawings wherein:

FIG. 3b shows a timing diagram for the alternate clock generator illustrated in FIG. 3a;

FIG. 4b shows a timing diagram for the alternate clock generator illustrated in FIG. 4a.

DETAILED DESCRIPTION

Figure 1:
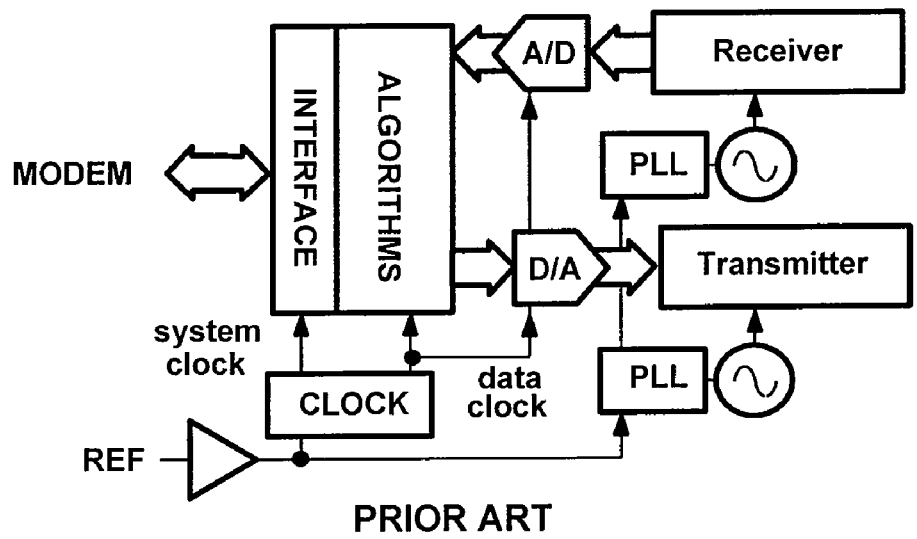
FIG. 1 shows a radio system with clock distribution.

A typical radio transceiver integrates RF circuits with digital logic as illustrated in FIG. 1. The transceiver includes a receiver and transmitter plus frequency synthesizers to cover a range of radio channels. The receiver selects the designated channel amongst noise and interfering signals and translates it to baseband, while the transmitter shifts the baseband message signal to the assigned radio frequency and amplifies it to complete the wireless link. Digital logic implements various algorithms and functions that improve radio performance as well as facilitate communication with a digital modulator-demodulator (modem).

Crystal oscillators provide low-noise, extremely accurate and stable signals. As such, they are generally used as the reference for all the frequency-critical signals, including the system clock, data clock, and the RF local oscillators (synthesizers).

Figure 2:
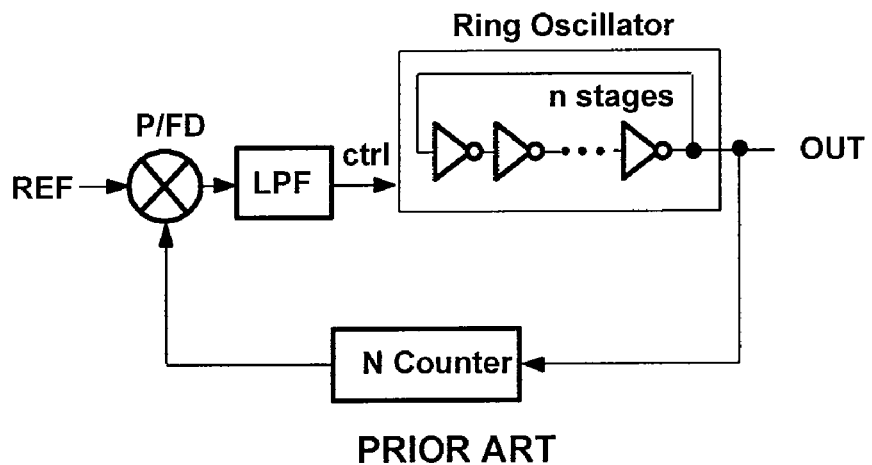
FIG. 2 shows a diagram of an integer-N PLL using a ring oscillator.

Most high-speed digital clocks are synthesized using a ring oscillator and an integer-N phase-locked loop, as shown in FIG. 2. This synthesizer consists of the phase/frequency detector (P/FD), low pass filter (LPF), N counter, and ring oscillator. Its output equals $$f_{clk} = N f_{ref} \qquad (1)$$

where $f_{ref}$ corresponds to the frequency of the reference source. The PLL drives the ring oscillator to satisfy the expression $$f_{clk} = \frac{1}{2n\tau_D} \quad (2)$$

where $\tau_D$ corresponds to the propagation delay of each individual stage. Ideally, the delay stages of the ring oscillator match and thereby produce internal signals (after the output of each stage) with equal phase offsets. The PLL's feedback allows the ring oscillator to achieve low jitter without inductor-based VCOs.

By design, the integer-N PLL only synthesizes output frequencies at integer multiples of the reference frequency. This not only limits the options for the digital clock rate, it more importantly fixes the frequency peaks associated with the digital noise spectrum. These noise peaks generally occur at integer multiples of the digital clocks used to drive the CMOS logic. That's because CMOS logic only draws supply current during switching transients. Moreover, these transients can be fairly large when numerous gates all switch at the same time as in synchronous designs.

The noise peaks are a fundamental problem. They potentially interact with strong interfering signals to desense the receiver. They also translate to the output and potentially degrade emissions produced by the transmitter. In practice, there invariably exist a set of frequency channels sensitive to the digital noise. The fixed system clock prevents any alternate solutions that avoid the digital noise.

Figure 3A:
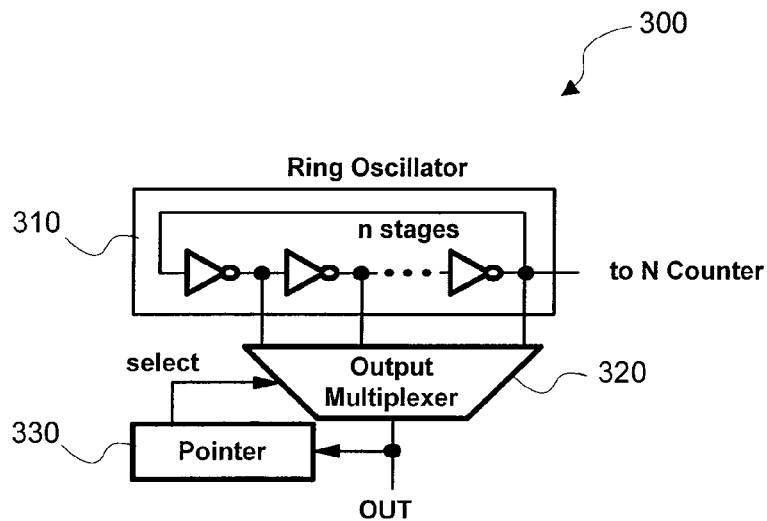
FIG. 3a shows an embodiment of an alternate clock generator in accordance with aspects of the present invention.

In accordance with aspects of the present invention, it is possible to generate a second or alternate clock to distribute the digital clock related noise to other frequencies. The alternate clock may be implemented by a modified clock generator embodiment 300 as shown in FIG. 3a. Ideally, this alternate clock operates as a phase-locked, non-integer multiple of the reference frequency. In addition, since the alternate clock may be used to drive the DSP processors and data converters (which consists of most of the high-speed logic gates) at a different clock frequency, it effectively shifts the frequency peaks of the digital noise spectrum. As a result, the radio performance at the affected frequency channels returns to its optimum performance level. (It is noted that a new and different set of sensitive frequency channels results with the alternate clock. Nevertheless, the availability of two clock frequencies makes it possible to select a data clock that avoids radio transceiver problems).

In typical embodiments the alternate clock may affect signal processing algorithms and therefore may require some modifications to the data path. This may be implemented with a simple and straightforward re-sampling operation. Any performance change with the alternate clock will typically be minimal.

In typical embodiments the original data clock still supports the interface circuitry that connects the radio transceiver to the modem. However, the noise levels associated with the original system clock are reduced since only the interface circuitry needs to operate at this frequency.

Figure 3B:
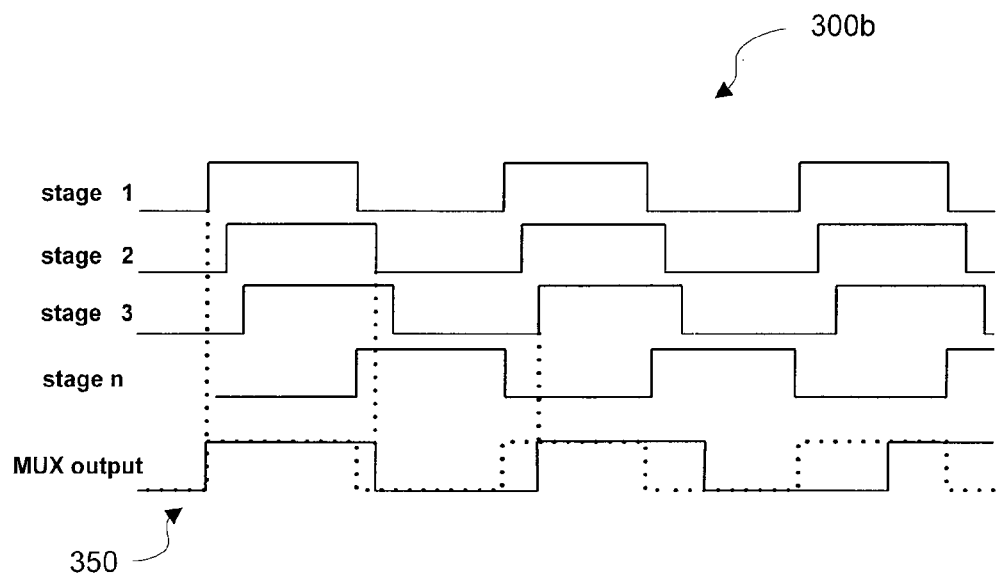

In accordance with embodiment 300, the alternate phase-locked clock may be generated as follows. By its nature, each matched stage of the ring oscillator 310 produces equally-spaced phases of the output signal. Normally, the system locks to a single phase of the ring oscillator and the output digital clock rate equals (2). The multiplexer 320, however, allows the system to step through the phase offsets natively produced by the ring oscillator 310 and form a different digital clock signal 350 as illustrated in timing diagram 300b of FIG. 3b. The output frequency then becomes $$f_{clk} = \frac{1}{(2n+m)\tau_D} \quad (3)$$

where m is the number of stages advanced during each digital clock cycle.

The logic that controls the multiplexer may be implemented in a straightforward manner. A pointer or counter may be incremented after each output transition to route the next phase offset to the multiplexer's output. The delay through the counter must equal or exceed the delay of any stage in the ring oscillator to ensure that the multiplexer switches to a phase offset at the same logic level as the previous offset signal. With proper design, the switching process does not add any jitter.

Incrementing the counter on only the positive edge or transitions (or alternatively only the negative transitions) of the output clock produces a slightly non-symmetric clock. This results in m=1 and the smallest clock rate change. In order to preserve a 50% duty cycle, the counter must increment on both positive and negative edges of the output clock. Here, m=2 and the alternative clock rate is somewhat lower. Table 1 lists the alternate clock rates for a few different ring oscillator designs with a nominal clock rate of 312 MHz, with m=1 for the non-symmetric clock and m=2 for the 50% duty cycle clock. Note that only one of the options produces an integer multiple of the 26 MHz reference frequency (286 MHz, with 11 stages and m=2).

TABLE 1

Alternate Data Clock Frequencies for m = 1 and m = 2

| | Non-symmetric | | 50% Duty Cycle | |
|---|---|---|---|---|
| Stages | $f_{clk}$ | $Nf_{ref}$ | $f_{clk}$ | $Nf_{ref}$ |
| 7 | 291.20 | 11.2 | 273.00 | 10.5 |
| 9 | 295.58 | 11.4 | 280.80 | 10.8 |
| 11 | 298.43 | 11.5 | 286.00 | 11.0 |
| 13 | 300.44 | 11.6 | 289.71 | 11.1 |
| | MHz | | MHz | |

Figure 4A:
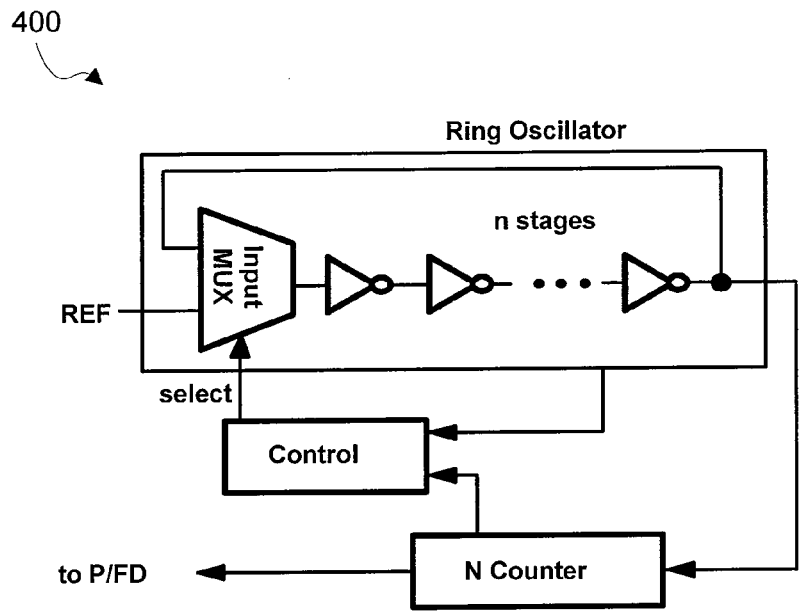
FIG. 4a shows an embodiment of an alternate clock generator with phase re-synchronization in accordance with aspects of the present invention.

In accordance with another aspect of the present invention, an embodiment of a re-synced ring oscillator 400 as shown in FIG. 4a may be used to reduce peak-to-peak jitter. In this embodiment, the reference signal's active edge is substituted for the ring oscillator's corresponding edge. This substitution may be done every N cycles of the data clock to prevent phase noise or jitter accumulation.

Normally, the multiplexer routes the output of the ring oscillator to its input. The PLL then ensures the delay through the ring oscillator satisfies both (2) and (3). As such, the ring oscillator produces N cycles of the data clock for each cycle of the reference source. Moreover, the PLL's phase/frequency detector aligns the reference signal to the transitions of the data clock, but more precisely to the output pulse produced by the N counter.

Figure 4B:
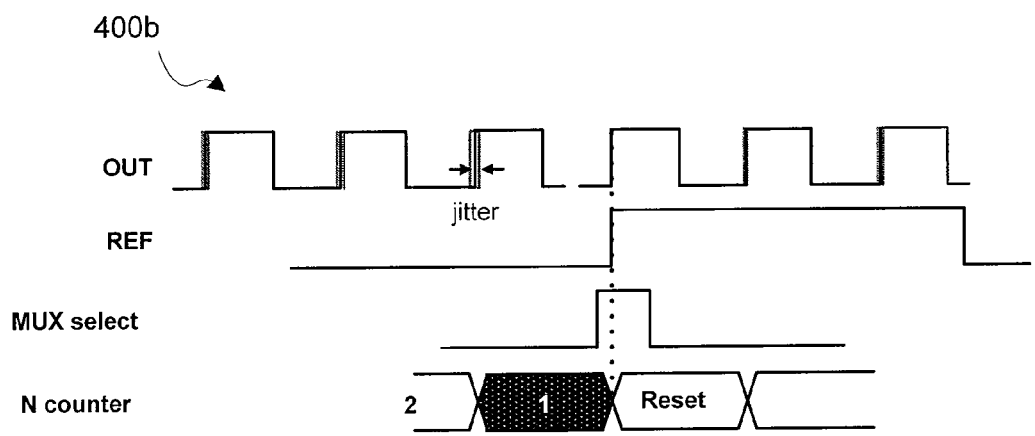

In embodiment 400 the control logic anticipates the output pulse and switches the multiplexer just before the N counter reaches terminal count to allow the reference source's next active edge to feed the ring oscillator. This is illustrated in FIG. 4b. It follows that the ring oscillator's output equals logic low and this matches the state of the reference signal.

The control logic then directs the multiplexer to reconnect the ring oscillator's output to its input just before the active edge reaches the last stage. This process effectively replaces and re-syncs every Nth active edge within the ring oscillator with a low-jitter edge from the reference source.

In accordance with various aspects of the present invention, a ring oscillator may be coupled with a multiplexer and control logic to provide a low-jitter output clock that can be readily altered to a non-integer multiple of the applied reference frequency to avoid noise problems with specific RF channel frequencies and enhance overall system performance.

The foregoing description, for purposes of explanation, used specific nomenclature to provide a thorough understanding of the invention. However, it will be apparent to one skilled in the art that specific details are not required in order to practice the invention. Thus, the foregoing descriptions of specific embodiments of the invention are presented for purposes of illustration and description. They are not intended to be exhaustive or to limit the invention to the precise forms disclosed; obviously, many modifications and variations are possible in view of the above teachings. The embodiments were chosen and described in order to best explain the principles of the invention and its practical applications, they thereby enable others skilled in the art to best utilize the invention and various embodiments with various modifications as are suited to the particular use contemplated. It is intended that the following claims and their equivalents define the scope of the invention.

What is claimed is:

1. Apparatus for providing an alternate clock signal, comprising:
   a ring oscillator;
   a multiplexer coupled to outputs of a plurality of stages of the ring oscillator; and
   a control circuit coupled to the multiplexer and configured to select two or more of the outputs of the plurality of stages of the ring oscillator to generate the alternate signal;
   wherein the control circuit is configured to select the two or more outputs of the plurality of stages by:
      selectively stepping through ones of outputs of the plurality of stages of the ring oscillator responsive to the outputs; and
      selecting one or more of the two or more outputs of the plurality of stages based at least in part on said stepping; and
   wherein the control circuit is configured to sequentially select two output stages of the two or more output stages to generate the alternate clock signal during each cycle of the alternate clock signal.

2. A method of generating an alternate clock signal, comprising:
   generating a plurality of time shifted signals at a first frequency based on an input frequency;
   selecting two or more of the time shifted signals; and
   generating an alternate clock signal based on said two or more of the time shifted signals,
   wherein said alternate clock signal is generated at a frequency that is different than the first frequency;
   wherein the two or more time shifted signals are generated by a plurality of stages of a ring oscillator;
   wherein the two or more time shifted signals are selected from sequential stages of the ring oscillator to provide the alternate clock signal; and
   wherein two of the two or more time shifted signals are sequentially selected during each cycle of the alternate clock signal.

3. A communications device comprising:
   a first clock circuit configured to generate a clock signal at a first clock frequency; and
   a second clock circuit configured to generate a second clock signal having an alternate clock frequency different from said first clock frequency, said second clock circuit comprising:
      a ring oscillator;
      a multiplexer coupled to the outputs of a plurality of stages of the ring oscillator; and
      a control circuit coupled to the multiplexer to select two or more of the outputs of the plurality of stages of the ring oscillator to generate an the second clock signal;
   wherein the control circuit is configured to select the two or more outputs of the plurality of stages by:
      selectively stepping through ones of outputs of the plurality of stages of the ring oscillator responsive to the second clock signal output; and
      selecting ones of the two or more outputs of the plurality of stages based on said stepping; and
   wherein the control circuit is configured to sequentially select two output stages of the two or more output stages to generate the alternate clock signal during each cycle of the second clock signal.

\* \* \* \* \*